United States Patent
Fortes et al.

(10) Patent No.: US 12,385,961 B2
(45) Date of Patent: Aug. 12, 2025

(54) METHOD FOR TOTAL ISOTROPIC SENSITIVITY TESTING OF A USER EQUIPMENT

(71) Applicant: Rohde & Schwarz GmbH & Co. KG, Munich (DE)

(72) Inventors: Jose Fortes, Madrid (ES); Juan-Angel Anton, Munich (DE); Vincent Abadie, Hoehenschaeftlarn (DE); Adrian Cardalda Garcia, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 351 days.

(21) Appl. No.: 18/315,129

(22) Filed: May 10, 2023

(65) Prior Publication Data

US 2024/0377445 A1 Nov. 14, 2024

(51) Int. Cl.
*H04B 17/318* (2015.01)
*G01R 29/10* (2006.01)

(52) U.S. Cl.
CPC ......... *G01R 29/105* (2013.01); *H04B 17/318* (2015.01)

(58) Field of Classification Search
CPC .............................. G01R 29/105; H04B 17/318
USPC ........................................................ 455/67.12
See application file for complete search history.

(56) References Cited

U.S. PATENT DOCUMENTS

| | | | | |
|---|---|---|---|---|
| 6,232,954 | B1* | 5/2001 | Rozzi | H04N 1/6033 358/518 |
| 10,575,315 | B2* | 2/2020 | Vangala | H04W 72/56 |
| 2002/0135569 | A1* | 9/2002 | Chen | G06F 3/045 345/173 |
| 2003/0086102 | A1* | 5/2003 | Soler | H04N 1/00087 358/1.9 |
| 2006/0002609 | A1* | 1/2006 | Casadei | G06F 18/24323 382/226 |
| 2015/0366738 | A1* | 12/2015 | Endo | G05B 15/02 482/4 |
| 2017/0234746 | A1* | 8/2017 | Cohen | G01L 27/005 73/1.08 |

(Continued)

FOREIGN PATENT DOCUMENTS

| | | |
|---|---|---|
| CN | 113068210 B | 10/2022 |
| CN | 115633370 A | 1/2023 |
| CN | 113098631 B | 3/2023 |

*Primary Examiner* — April G Gonzales
(74) *Attorney, Agent, or Firm* — Studebaker Brackett PLLC

(57) ABSTRACT

The present disclosure relates to a method for total isotropic sensitivity, TIS, testing of a user equipment, UE. The method includes forwarding a first test signal towards the UE, wherein the first test signal is forwarded from a number of spherical coordinates around the UE; recording a respective RSS value; forwarding a second test signal towards the UE from the spherical coordinate; recording further RSS values for each of the different power levels of the second rest signal; calculating a linearization pattern which relates the further RSS values to the corresponding power levels of the second test signal; calculating a combined RSS value based on the RSS values recorded by the n receiver branches at the spherical coordinate in response to the first test signal; determining an equivalent isotropic sensitivity, EIS, value of the UE for the spherical coordinate; and calculating a EIS value for additional spherical coordinate(s).

12 Claims, 3 Drawing Sheets

(56) References Cited

U.S. PATENT DOCUMENTS

| | | | |
|---|---|---|---|
| 2018/0115850 A1* | 4/2018 | De Burgh | H04S 7/303 |
| 2018/0307220 A1* | 10/2018 | Hammerschmidt | G05B 23/0213 |
| 2019/0073444 A1* | 3/2019 | Berthoumieux | G16B 15/00 |
| 2019/0114464 A1* | 4/2019 | Nicolle | G06V 20/69 |
| 2019/0288780 A1* | 9/2019 | Rodriguez-Herrera | H04B 7/0413 |
| 2019/0373495 A1* | 12/2019 | Ouyang | H04W 16/28 |
| 2019/0386760 A1* | 12/2019 | Li | H04W 24/06 |
| 2020/0119443 A1* | 4/2020 | Leather | H04B 17/102 |
| 2020/0186261 A1* | 6/2020 | Devarasetty | H04B 7/0617 |
| 2020/0322812 A1* | 10/2020 | Shi | H04W 16/28 |
| 2021/0333410 A1* | 10/2021 | Gum | G01S 19/48 |
| 2022/0272812 A1* | 8/2022 | Netzer | H02M 3/156 |
| 2022/0350030 A1* | 11/2022 | Shuman | G01S 19/48 |
| 2022/0353688 A1* | 11/2022 | Shuman | H04W 12/122 |
| 2023/0280153 A1* | 9/2023 | Stromski | G01B 9/02055 356/450 |
| 2023/0344533 A1* | 10/2023 | Wang | H04B 17/318 |

\* cited by examiner

METHOD FOR TOTAL ISOTROPIC SENSITIVITY TESTING OF A USER EQUIPMENT

TECHNICAL FIELD

In general, the disclosure relates to over-the-air, OTA, testing of user equipment, such as wireless communication devices. More specifically, the disclosure relates to a method for total isotropic sensitivity testing of a user equipment.

BACKGROUND ART

Total isotropic sensitivity (TIS) testing is a common OTA testing procedure for wireless user equipment, such as wireless communication devices. Thereby, TIS is a figure of merit for the radiated performance of a receiver of the user equipment. Conventional TIS testing procedures are, for instance, defined in standardized test plans of industry organizations, such as CTIA.

However, conventional fast TIS testing procedures assume that the UE has only a single wireless receiver. If the user equipment comprises several wireless receivers, performing conventional TIS testing can become very time consuming.

SUMMARY

Thus, there is a need to provide an improved TIS testing method which enables a faster TIS testing of a user equipment that comprises several wireless receivers.

This is achieved by the embodiments provided in the enclosed independent claim. Advantageous implementations of the present disclosure are further defined in the dependent claims.

The present disclosure relates to a method for total isotropic sensitivity, TIS, testing of a user equipment, UE, which comprises n receiver branches. The method comprising the steps of: forwarding a first test signal at a fixed power level towards the UE, wherein the first test signal is forwarded from a number of spherical coordinates around the UE; recording a respective RSS value for each of the n receiver branches of the UE and for each of the number of spherical coordinates in response to the first test signal; for each of the n receiver branches of the UE: forwarding a second test signal at varying power levels towards the UE from the spherical coordinate where the strongest RSS value was recorded with this receiver branch, recording further RSS values for each of the different power levels of the second rest signal at said spherical coordinate, and calculating a linearization pattern which relates the further RSS values to the corresponding power levels of the second test signal. The method further comprises: for each of the number of spherical coordinates, calculating a combined RSS value based on the RSS values recorded by the n receiver branches at said spherical coordinate in response to the first test signal; determining an equivalent isotropic sensitivity, EIS, value of the UE for the spherical coordinate with the biggest combined RSS value based on a sensitivity search at said spherical coordinate; and calculating a respective EIS value for at least a further one of the spherical coordinates based on the determined EIS value and the calculated linearization patterns of the n receiver branches.

This achieves the advantage that a TIS testing of a UE with multiple receivers can be carried out in a fast and efficient way.

The UE can be a wireless UE, such as wireless communication device (e.g., a smartphone). For instance, the UE is an LTE and/or NR FR1 device. The UE can be a device-under-test (DUT) or an equipment-under-test (EUT).

In particular, the number n of receiver branches of the UE is larger than one (n>1). In other words, the UE can comprise a plurality of receiver branches.

The first test signal and the second test signal can be radio frequency (RF) signals, in particular RF signals in a frequency range which is used for communication according to the 4G, 5G and/or 6G standards. Each of the n receiver branches of the UE can be configured to receive at least a portion of the first and/or the second test signal.

The first test signal can be forwarded successively from the number of spherical coordinates towards the DUT, e.g. in a step by step manner. For example, a spiral scan of the UE can be carried out with the first test signal.

For example, the power level of the second test signal can be increased or decreased in a stepwise manner, e.g. in steps of 1 db over a power range of e.g. 10 db.

The RSS values can be recorded by the UE and, e.g., saved in a memory of the UE at least temporarily. The RSS values can be transmitted to a test system for evaluation, e.g. for calculating/determining the linearization pattern and/or the EIS value(s).

Preferably, respective EIS values are calculated for each of the number of spherical coordinates based on the determined EIS value and the calculated linearization patterns of the n receiver branches.

In an implementation form, the method comprises the further step of: determining a TIS value of the UE based on the determined EIS values. In particular, the TIS value can be determined based on the calculated respectively determined EIS values for some or all of the number of spherical coordinates.

In an implementation form, the first and/or the second test signal comprise at least one cell specific reference signal.

For example, the first and/or the second test signal comprise a reference signal in a FR1 band.

In particular, FR1 (frequency range 1) is a frequency range from 410 MHz to 7,125 MHz. FR1 can comprise a plurality of frequency bands, e.g. for 5G New Radio, within its frequency range.

In an implementation form, the determined RSS values are reference signal reported power, RSRP, values or reference signal antenna power, RSAP, values.

For instance, RSRP represents the average power of a reference signal, e.g. an LTE reference signal, and is typically measured in dbm. The RSS value can be a SS reference signal received power per branch (SS-RSRPB) value.

In an implementation form, the RSS values which are recorded in response to the first test signal are determined for two polarizations.

In an implementation form, the further RSS values which are recorded in response to the second test signal and/or the EIS value for the spherical coordinate with the biggest combined RSS value are determined for a single polarization.

In an implementation form, an RSS pattern is determined for each of the n receiver branches based on the RSS values recorded in response to the first test signal, wherein the RSS pattern comprises a grid of RSS values with corresponding spherical coordinates.

For instance, when calculating the EIS values for further spherical coordinates, the RSS pattern can be taken into account.

In an implementation form, the UE is placed on a 3D positioner in an anechoic chamber during the TIS testing.

The anechoic chamber and the 3D positioner can be a part of a test system which carries out the TIS testing. The test system can further comprise a test antenna arrangement for generating the first and the second test signals, a communication interface for receiving the recorded RSS values from the UE, and a processor for calculating the linearization pattern, the EIS value(s) and/or the TIS value of the UE.

In an implementation form, at least one of the n receiver branches comprises an antenna of the UE which is connected to a TX/RX path of the UE.

For example, each receiver branch comprises a respective TX/RX antenna. Alternatively or additionally, each receiver branch can comprise a dedicated receiver and/or receiver path.

In an implementation form, the linearization pattern at a spherical coordinate is calculated by a linear interpolation of the further RSS values.

In an implementation form, the combined RSS value is calculated based on a sum of the RSS values recorded by the n receiver branches at said spherical coordinate in response to the first test signal.

BRIEF DESCRIPTION OF THE DRAWINGS

The above-described aspects and implementation forms of the present disclosure will be explained in the following description of specific embodiments in relation to the enclosed drawings, in which.

DETAILED DESCRIPTIONS OF EMBODIMENTS

Figure 1:
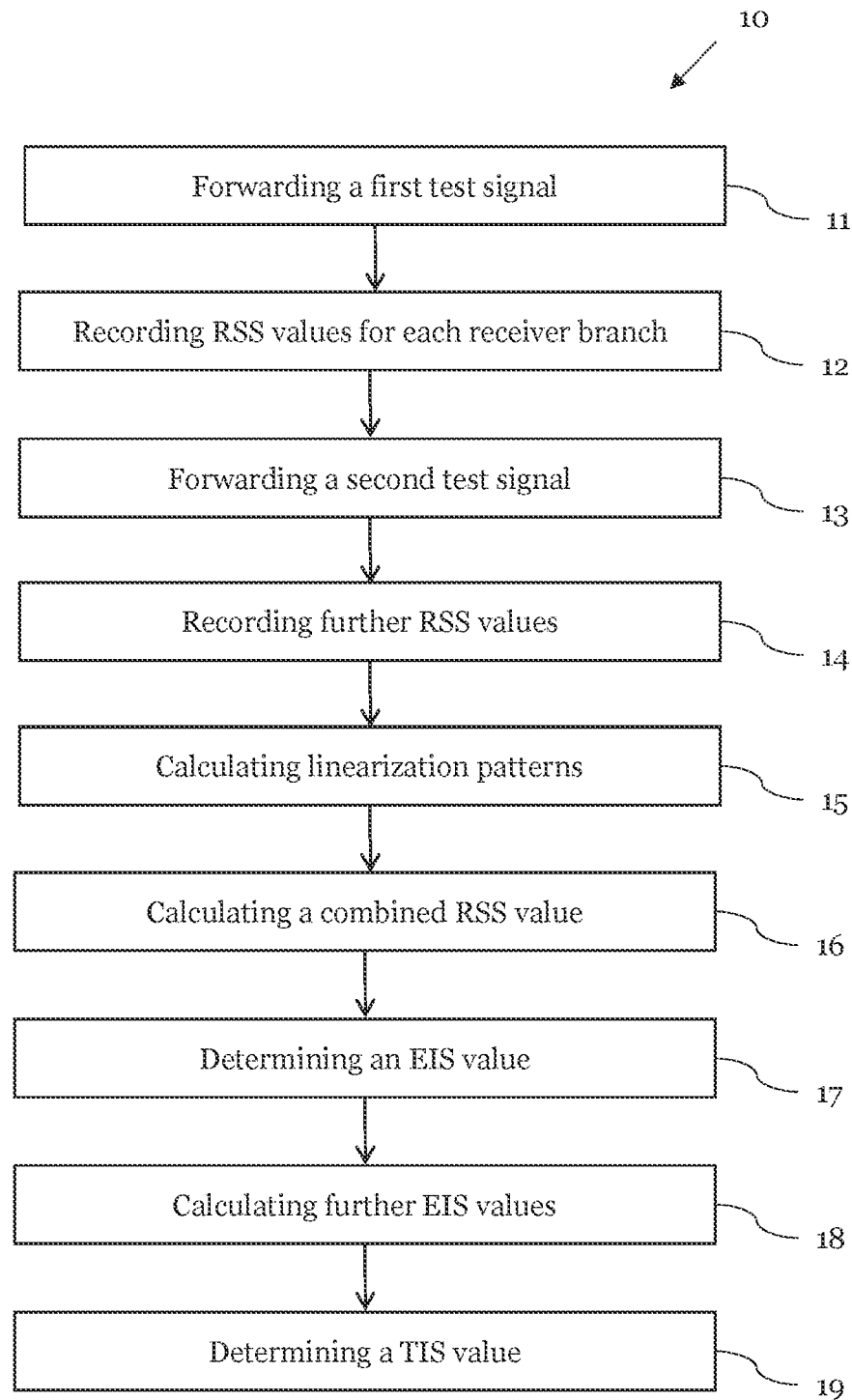
FIG. 1 shows a flow diagram of a method for TIS testing of a UE with n receiver branches according to an embodiment.

FIG. 1 shows a flow diagram of a method 10 for TIS testing of a UE with n receiver branches according to an embodiment.

The method comprising the steps of: forwarding 11 a first test signal at a fixed power level towards the UE, wherein the first test signal is forwarded from a number of spherical coordinates around the UE; and recording 12 a respective RSS value for each of the n receiver branches of the UE and for each of the spherical coordinates in response to the first test signal. The method 10 further comprises: for each of the n receiver branches of the UE: forwarding 13 a second test signal at varying power levels towards the UE from the spherical coordinate where the strongest RSS value was recorded with this receiver branch, recording 14 further RSS values for each of the different power levels of the second rest signal at said spherical coordinate, and calculating 15 a linearization pattern which relates the further RSS values to the corresponding power levels of the second test signal. The method 10 further comprises: for each of the number of spherical coordinates, calculating 16 a combined RSS value based on the RSS values recorded by the n receiver branches at said spherical coordinate in response to the first test signal; determining 17 an equivalent isotropic sensitivity, EIS, value of the UE for the spherical coordinate with the biggest combined RSS value based on a sensitivity search at said spherical coordinate; and calculating 18 a respective EIS value for at least a further one of the spherical coordinates based on the determined EIS value and the calculated linearization patterns of the n receiver branches.

The method 10 can further comprise the step of: determining 19 a TIS value of the UE based on the EIS values which were determined respectively calculated for the number of spherical coordinates in steps 17 and/or 18.

For instance, in step 18, respective EIS values are calculated for one, more or all further spherical coordinates around the UE.

The spherical coordinates can be coordinates on a spherical grid around the UE.

The UE is preferably a wireless UE, such as wireless communication device (e.g., a smartphone). For instance, the UE is a LTE and/or NR FR1 device.

Each of the n receiver branches of the UE may comprise a separate receiver and/or antenna of the UE. An example of a receiver branch is a physical antenna connected to one of the TX/RX paths in a UE chipset.

The determined RSS values can be RSRP ("reference signal reported power" or "reference signal received power") values or RSAP ("reference signal antenna power") values. The RSRP (or RSAP) values can be recorded "per branch" (i.e., for each receiver branch of the UE) as a RSRPB ("reference signal reported power per branch") values.

The first test signal and/or the second test signal can each comprise at least one cell specific reference signal. For instance, the first test signal and/or the second test signal each comprise a signal in a FR1 band, with FR1 being a frequency range from 410 MHz to 7,125 MHz.

The first and the second test signal can be RF signals in the same frequency range and/or can comprise reference signals in the same frequency range.

Steps 11 and 12 can form a "pattern measurement step". An RSS pattern can be determined based on the recorded RSS values for the number of spherical coordinates. For instance, the RSS pattern represents a grid of RSS values, wherein each recorded RSS is stored together with grid coordinates representing the spherical coordinates at which it was recorded.

For instance, during the pattern measurement step, a fixed DL (downlink) power from a tester to the UE (i.e., the first test signal) is used to scan a whole sphere around the UE, wherein at least n values are recorded for the n reported RSRPB values from the UE. This measurement can be carried out in an anechoic chamber, where the UE is placed on a 3D positioner.

The "pattern measurement" of steps 11 and 12 can be performed on two polarizations for each spherical position.

Steps 13 to 15 can form a "pattern linearization step" which can be performed n-times for the n receiver branches and the directions providing the best RSRPB reported value from the UE. Typically, it is expected that the best positions (i.e., spherical coordinates with the biggest RSS value in response to the first test signal) will be different for the different receiver branches.

The linearization pattern at a spherical coordinate can be calculated by a linear interpolation of the further RSS values.

Preferably, the sensitivity search (step 17) is performed only once for the point providing the best combined RSRP, calculated from the RSRP per branch in step 16. The result of the sensitivity search in step 17 can be an EIS value at this selected spherical coordinate.

The combined RSS value (in step 16) can be calculated based on a sum of the RSS values recorded by the n receiver branches at said spherical coordinate in response to the first test signal.

For example, the pattern linearization step and the sensitivity search are performed on a single polarization.

The TIS value can be calculated in step 19 based on the calculated EIS values per spherical position and on the linearized RSRPB values, as well as based on the "best" EIS value determined in step 17.

Figure 2:
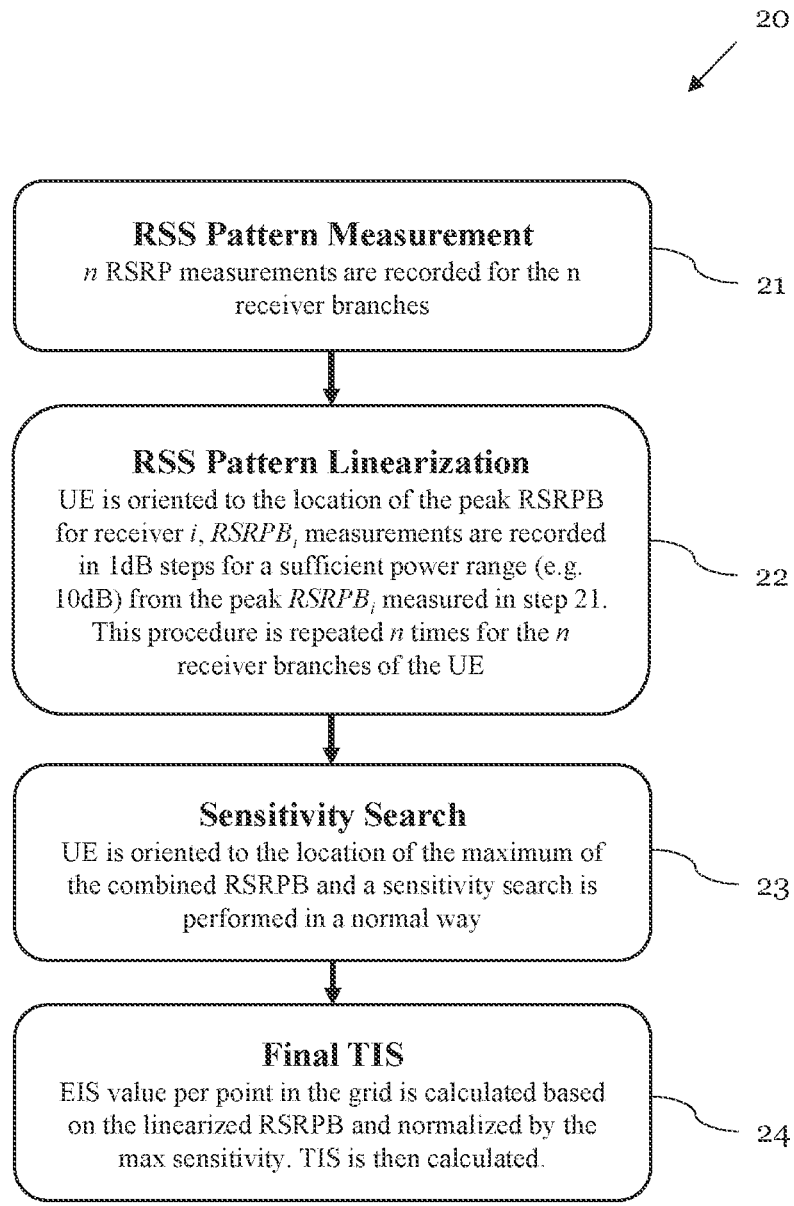
FIG. 2 shows a flow diagram of a method for TIS testing of a UE with n receiver branches according to an embodiment.

FIG. 2 shows a flow diagram of a method 20 for TIS testing of the UE according to an embodiment. The method 20 shown in FIG. 2 can be equivalent to the method 10 shown in FIG. 1 and can comprise the same basic steps.

The method 20 comprises an RSS pattern measurement step 21, which can be equivalent to steps 11 and 12 of the method 10 show in FIG. 1. For instance, during step 21, a spherical measurement is performed at a fixed DL (downlink) power level and n RSRP measurements are recorded for the n receiver branches in the UE, at each polarization and point on a sphere around the UE. For example, SS reference signal received power per branch (SS-RSRPB) values are recorded for NR FR1 UEs and Reference Signal Antenna Power (RSAP) values are used for LTE UEs. In the following. RSRPB is used as generic term to refer to SS-RSRPB or RSAP.

The method 20 further comprises an RSS pattern linearization step 22, which can be equivalent to steps 13-15 of the method 10 shown in FIG. 1. During step 22, RSRPB measurements as performed in step 21 can be linearized independently for each of the n receiver branches of the UE. In order to do so, the UE can be oriented to the location where the peak RSRPB value was recorded for a receiver branch i, and $RSRPB_i$ measurements (for said branch i) are recorded in 1 dB steps for a sufficient power range (e.g., 10 dB) from the peak $RSRPB_i$ measured in step 21. This procedure can be repeated n times for the n receiver branches of the UE.

For instance, the RSRPB values can be linearized by linear interpolation. In this way, the UE response can be calibrated to the signal generator which generates the test signal(s). The resulting linearization curve can be a function of an output power of the signal generator.

During a following sensitivity search step 23, which can be equivalent to steps 16-17 of the method 10 shown in FIG. 1, the UE can be oriented towards the spherical coordinate of the maximum of the combined RSRPB values from step 21. Thereby, the combined RSRPB can be calculated in the following way:

$$RSRPB_{combined} = \max(RSRPB_1 + \ldots + RSRPB_n)$$

In this orientation, a sensitivity search can be performed in a conventional way. As a result, an EIS value at said spherical coordinate can be calculated.

The sensitivity search can be performed by recording error rates versus signal level of a downlink signal provided to the UE. For example, during the sensitivity search, an RF signal is generated and forwarded to the UE, e.g. by a signal generator, wherein the UE receives the RF signal and detects a data error rate. An output power of a signal generator which generates the RF signal can be slowly reduced until a specific error rate at the UE is reached. This threshold value can be called the equivalent (or effective) isotropic sensitivity, EIS.

Here, the UE being oriented may refer to the spatial orientation of the UE is changed relative to a test signal source (e.g., a test antenna), e.g., by a 3D positioner, and/or the orientation of the test signal source (in particular, its antenna) is changed relative to the UE.

In a final TIS calculation step 24, which can be equivalent to steps 18-19 of the method 10 shown in FIG. 1, the EIS values per point in the grid (i.e., for each further spherical coordinate) can calculated as follows (in linear units):

$$EIS(\theta, \phi) = \frac{1}{\left(\frac{1}{EIS_1(RSRPB_{1,lin}(\theta, \phi))} + \ldots + \frac{1}{EIS_n(RSRPB_{n,lin}(\theta, \phi))}\right)}$$

Thereby, $RSRPB_{i,lin}$ is the linearized RSRPB value for receiver branch i and can be calculated as follows:

$$RSRPB_{i,lin}(\theta, \phi) = P_i(\theta, \phi) \cdot c + m,$$

where P is the DL power level corresponding to $RSRPB_i$ in the linearization trace, and c and m are the coefficients of the BFLS regression line to which the linearization trace can be fitted (e.g., during linearization step 22). Here, $\theta$ and $\phi$ can be spherical grid coordinates.

The $EIS_i$ value can be calculated by referring the linearized RSRPB values per branch ($RSRPB_{1 \ldots n, lin}$) to the single EIS value determined by the sensitivity search in step 23. In an example, the linearized RSRPB values can first be normalized by dividing them by a "maximum" DL power level. The $EIS_i$ value can then be calculated by a multiplication of the (preferably normalized) linearization of RSRPB with the reference EIS value determined in step 23.

The calculation of the TIS value can be carried out as defined in a test plan for wireless device over-the-air performance by the CTIA organization (CTIA 01.90). For instance, the TIS value can be calculated as follows:

$$TIS \cong \left[\frac{1}{2}\sum_{i=0}^{N} w_i \text{cut}_i\right]^{-1}$$

with $$\text{cut}_i = \frac{1}{M}\sum_{j=0}^{M-1}\left[\frac{1}{EIS_\theta(\theta_i, \phi_j)} + \frac{1}{EIS_\phi(\theta_i, \phi_j)}\right]$$

and $w_i$ being a Clenshaw-Curtis weighting factor.

Figure 3:
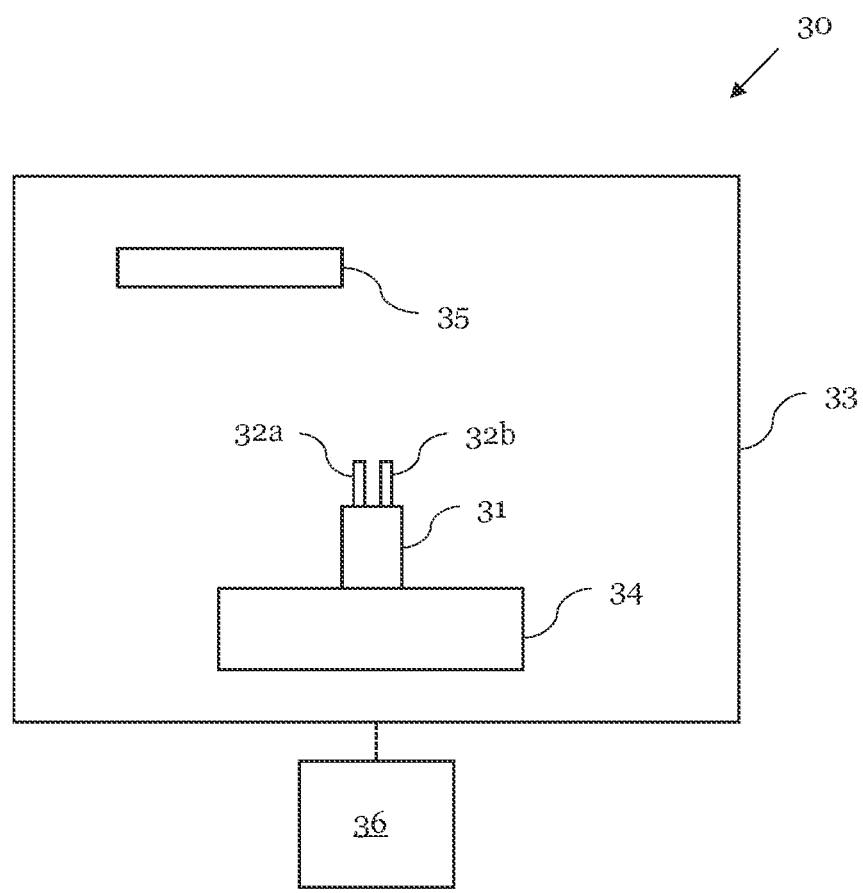
FIG. 3 shows a schematic diagram of a system for TIS testing of a UE with n receiver branches according to an embodiment.

FIG. 3 shows a schematic diagram of a system 30 for TIS testing of the UE 31 according to an embodiment.

For instance, the UE 31 can be a communication device with multiple receivers, each receiver being connected to an antenna 32a, 32b of the device.

The system can comprise an anechoic chamber 33. For performing the TIS test, the UE 31 can be placed on a 3D positioner 34 in the chamber 33. The system can further comprise a test signal generator connected to a test antenna arrangement 35 for generating and forwarding the test signals towards the UE 31 over the air. By means of the 3D positioner 34, the orientation of the UE 31 towards the test antenna arrangement 35 can be changed, e.g., to forward the test signals from the various spherical coordinates around the UE 31.

The system may comprise a processor 36 which is configured to calculate the various parameters based on the RSS values. For instance, the processor 36 can be configured to calculate, the linearization pattern, the combined RSS value, the EIS value (based on the sensitivity search), the further EIS values and/or the TIS value. The system 30 can further comprise a communication interface which is connected to the UE 31 and configured to receive the recorded RSS values from the UE 31 and forward them to the processor.

All features described above or features shown in the figures can be combined with each other in any advantageous manner within the scope of the disclosure.

The invention claimed is:

1. A method for total isotropic sensitivity, TIS, testing of a user equipment, UE, which comprises n receiver branches, the method comprising the steps of:
   forwarding a first test signal at a fixed power level towards the UE, wherein the first test signal is forwarded from a number of spherical coordinates around the UE;
   recording a respective RSS value for each of the n receiver branches of the UE and for each of the number of spherical coordinates in response to the first test signal;
   for each of the n receiver branches of the UE:
      forwarding a second test signal at varying power levels towards the UE from the spherical coordinate where the strongest RSS value was recorded with this receiver branch,
      recording further RSS values for each of the different power levels of the second rest signal at said spherical coordinate, and
      calculating a linearization pattern which relates the further RSS values to the corresponding power levels of the second test signal;
   for each of the number of spherical coordinates, calculating a combined RSS value based on the RSS values recorded by the n receiver branches at said spherical coordinate in response to the first test signal;
   determining an equivalent isotropic sensitivity, EIS, value of the UE for the spherical coordinate with the biggest combined RSS value based on a sensitivity search at said spherical coordinate; and
   calculating a respective EIS value for at least a further one of the spherical coordinates based on the determined EIS value and the calculated linearization patterns of the n receiver branches.

2. The method of claim 1, further comprising the step of:
   determining a TIS value of the UE based on the determined EIS values.

3. The method of claim 1,
   wherein the first and/or the second test signal comprise at least one cell specific reference signal.

4. The method of claim 1,
   wherein the first and/or the second test signal comprise a reference signal in a FR1 band.

5. The method of claim 1,
   wherein the determined RSS values are reference signal reported power, RSRP, values or reference signal antenna power, RSAP, values.

6. The method of claim 1,
   wherein the RSS values which are recorded in response to the first test signal are determined for two polarizations.

7. The method of claim 1,
   wherein the further RSS values which are recorded in response to the second test signal and/or the EIS value for the spherical coordinate with the biggest combined RSS value are determined for a single polarization.

8. The method of claim 1,
   wherein an RSS pattern is determined for each of the n receiver branches based on the RSS values recorded in response to the first test signal, wherein the RSS pattern comprises a grid of RSS values with corresponding spherical coordinates.

9. The method of claim 1,
   wherein the UE is placed on a 3D positioner in an anechoic chamber during the TIS testing.

10. The method of claim 1,
    wherein at least one of the n receiver branches comprises an antenna of the UE which is connected to a TX/RX path of the UE.

11. The method of claim 1,
    wherein the linearization pattern at a spherical coordinate is calculated by a linear interpolation of the further RSS values.

12. The method of claim 1,
    wherein the combined RSS value is calculated based on a sum of the RSS values recorded by the n receiver branches at said spherical coordinate in response to the first test signal.

* * * * *